United States Patent
Chae et al.

(10) Patent No.: US 7,652,745 B2
(45) Date of Patent: Jan. 26, 2010

(54) LIQUID CRYSTAL DISPLAY PANEL AND A FABRICATING METHOD THEREOF THAT ARE CAPABLE OF FORMING AN INSULATING FILM EXPOSING A METAL PATTERN WITHOUT A PHOTOLITHOGRAPHY PROCESS

(75) Inventors: Gee Sung Chae, Incheon (KR); Jin Wuk Kim, Kyounggi-do (KR)

(73) Assignee: LG Display Co., Ltd., Seoul (KR)

( * ) Notice: Subject to any disclaimer, the term of this patent is extended or adjusted under 35 U.S.C. 154(b) by 70 days.

(21) Appl. No.: 10/868,793

(22) Filed: Jun. 17, 2004

(65) Prior Publication Data

US 2005/0001967 A1 Jan. 6, 2005

(30) Foreign Application Priority Data

Jun. 19, 2003 (KR) .................... 10-2003-0039641

(51) Int. Cl.
*G02F 1/13* (2006.01)
*G02F 1/1333* (2006.01)

(52) U.S. Cl. ..................... 349/187; 349/138
(58) Field of Classification Search ............... 349/138, 349/187

See application file for complete search history.

(56) References Cited

U.S. PATENT DOCUMENTS

| 6,399,257 | B1 * | 6/2002 | Shirota et al. ................. 430/7 |
| 2001/0004280 | A1 * | 6/2001 | Kim et al. ................. 349/187 |
| 2002/0075422 | A1 * | 6/2002 | Kimura et al. ................ 349/43 |
| 2003/0214620 | A1 * | 11/2003 | Kim et al. ................... 349/155 |
| 2004/0027514 | A1 * | 2/2004 | Kobayashi et al. .......... 349/110 |

FOREIGN PATENT DOCUMENTS

| JP | 04279046 A | * 10/1992 |
| JP | 9-162161 A | 6/1997 |
| JP | 2003-158134 A | 5/2003 |
| KR | 2001-0057025 A | 7/2001 |

* cited by examiner

*Primary Examiner*—Andrew Schechter
(74) *Attorney, Agent, or Firm*—Birch, Stewart, Kolasch & Birch, LLP

(57) ABSTRACT

A liquid crystal display panel and a fabricating method that forms an insulating film exposing a metal pattern without a photolithography process. The liquid crystal display panel comprises: a metal pattern having first and second surface processing regions having a different reacting property for a specific solution; and an insulating film of a material representing a property identical to that of the second surface processing region, the insulating film being formed on a metal pattern of the second surface processing region in order to expose the first surface processing region of the metal pattern.

5 Claims, 11 Drawing Sheets

LIQUID CRYSTAL DISPLAY PANEL AND A FABRICATING METHOD THEREOF THAT ARE CAPABLE OF FORMING AN INSULATING FILM EXPOSING A METAL PATTERN WITHOUT A PHOTOLITHOGRAPHY PROCESS

This application claims the benefit of the Korean Patent Application No. P2003-39641 filed in Korea on Jun. 19, 2003, the subject matter of which is hereby incorporated by reference in its entirety.

BACKGROUND OF THE INVENTION

1. Field of the Invention

The present invention relates to a liquid crystal display panel, and more particularly, to a liquid crystal display panel and a fabricating method thereof that are capable of forming an insulating film exposing a metal pattern without a photolithography process.

2. Description of the Related Art

In general, a liquid crystal display (LCD) controls the light transmittance of liquid crystal cells using electric field, to thereby display a picture on a liquid crystal display panel. To this end, the LCD includes a liquid crystal display panel having liquid crystal cells arranged in an active matrix form, and driving circuits for driving the liquid crystal panel. The liquid crystal display panel is provided with pixel electrodes and a reference electrode, i.e. common electrode, to supply the electric field to each one of the liquid crystal cells. Usually, the pixel electrode is assigned to each one of the liquid crystal cells on a lower substrate, while the common electrode is formed as an integrated whole on the entire surface of an upper substrate. Each pixel electrode is connected to a thin film transistor (TFT) that is used as a switching element. The pixel electrode together with the common electrode drives the liquid crystal cell in response to data signals supplied via the TFT.

As shown in FIG. 1, a liquid crystal display panel in accordance with a related art includes upper and lower array substrates 10 and 20 combined together, and a liquid crystal material 8 between the upper and the lower array substrates 10 and 20.

The liquid crystal molecules of material 8 rotates, in response to the supplied electric field, to thereby regulate the transmittance of incident light via the lower array substrate 20.

The upper array substrate 10 includes a color filter 4 and a common electrode 6 formed on a rear surface of the upper substrate 1. The color filter 4, where red (R), green (G), and blue (B) colored filter layers are arranged in a stripe fashion, makes it possible to display colors by selectively passing light having specific wavelengths. A black matrix 2 is placed between the adjacent colored filters 4, and prevents the degradation of the contrast ratio by absorbing the light incident from the adjacent cells.

The lower array substrate 20 includes: a data line 18 and gate line 12 which cross each other and are insulated by a gate insulating layer formed on the entire surface of the lower substrate 21; and a TFT 16 placed on the crossing of the data and gate lines. The TFT 16 includes: a gate electrode connected to the gate line 12; a source electrode connected to the data line 18; and a drain electrode facing with the source electrode with a channel portion including an active layer and an ohmic contact layer therebetween. The TFT 16 is connected to the pixel electrode 14 via a contact hole passing through a passivation film. In response to gate signals from the gate line 12, the TFT 16 selectively supplies data signals from the data line 18 to the pixel electrode 14.

The pixel electrode 14 is made from a transparent conductive material having a high light transmittance, and is placed on a cell region defined by the data line 18 and gate line 12. An electric potential difference is generated between the pixel electrode 14 and the common electrodes 6 by data signals supplied via the drain electrode. Under the influence of this electric potential difference, the liquid crystal cell residing between the upper and lower substrates 1 and 21 rotates due to the dielectric anisotropy thereof. As a result, the light supplied via the pixel electrode 14 from the light source passes toward the upper substrate 1.

Depending on the circumstances, insulating film 30 including at least one of the gate insulating film and the passsivation film formed on the related art liquid crystal display panel exposes a metal pattern 32 located at its lower portion as shown in FIG. 2. For instance, the passivation film exposes the drain electrode in order to contact the drain electrode with the pixel electrode of the thin film transistor.

In order to expose the metal pattern 32, a photo-resist is coated on the substrate 21 provided with the insulating film 30 and then is by a photolithography employing an exposing process and a developing process using a mask, to thereby form a photo-resist pattern. The insulating film 30 is etched using the photo-resist as a mask so that the metal pattern 32 is exposed.

Because the photolithography process using the mask is required for exposing the metal pattern 32 located at the lower portion of the insulating film 30, the process is complicated and, as a result there is a problem that production cost is increased.

SUMMARY OF THE INVENTION

Accordingly, it is an object of the present invention to provide a liquid crystal display panel and a fabricating method thereof that are capable of forming an insulating film exposing a metal pattern without a photolithography process.

In order to achieve these and other objects of the invention, a liquid crystal panel according to the present invention comprises: a metal pattern having first and second surface processing regions having a different reacting property for a specific solution; and an insulating film of a material representing a property identical to that of the second surface processing region, the insulating film being formed on a metal pattern of the second surface processing region in order to expose the first surface processing region of the metal pattern.

The first surface processing region is a hydrophobic region and the second surface processing region is a hydrophilic region.

The insulating film is made of a hydrophilic material.

The insulating film includes at least any one of: a high polymer organic material having a polyvinyl alcohol, a polyvinyl phenol and a novolak resin; an inorganic insulating material dispersed to a solvent such as an alcohol system and water; and an organic/inorganic hybrid type insulating material.

The liquid crystal display crystal display panel further comprises: a gate line; a data line crossing to be insulated from the gate line, with the gate insulating film therebetween; a thin film transistor placed on the crossing of the gage line and the data line; a pixel electrode formed on a passivation film for protecting the thin film transistor and connected to the thin film transistor; a storage capacitor for preventing a change of voltage in the pixel electrode; a gate pad for supplying a gate signal to the gate line; and a data pad for supplying a data signal to the data line.

The metal pattern includes at least any one of; a drain electrode of the thin film transistor, a storage electrode of the storage capacitor, a lower data electrode of the data pad and a lower gate electrode of the gate pad.

The insulating film includes at least any one of the gate insulating film and the passivation film.

In order to achieve these and other objects of the invention, a method of fabricating a liquid crystal display panel according to the present invention includes steps of forming a metal pattern; surface-processing the metal pattern in order to have first and second surface processing regions that represent a different reacting property each other for a specific solution; and forming an insulating film of a material representing a property identical to that of the second surface processing region on the metal pattern of the second surface processing region on the metal pattern of the second surface processing region in order to expose the first surface processing region of the metal pattern.

The step of surface-processing the metal pattern includes irradiating a portion of the second surface processing region with UV to form the first surface processing region.

The step of surface-processing the metal pattern includes pressuring a pattern mold material on a portion of the second surface processing region to form the first surface processing region;

The first surface processing region is hydrophobic The first surface processing region is a hydrophobic region and the second surface processing region is a hydrophilic region.

The insulating film is made of a hydrophilic material.

The insulating film includes at least any one of: a high polymer organic insulating material having a polyvinyl alcohol, a polyvinyl phenol and a novolak resin; an inorganic insulating material dispersed to a solvent; and an organic/inorganic hybrid type insulating material.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Hereinafter, the preferred embodiments of the present invention will be described in detail with reference to FIGS. 3 to 6D.

Figure 1:
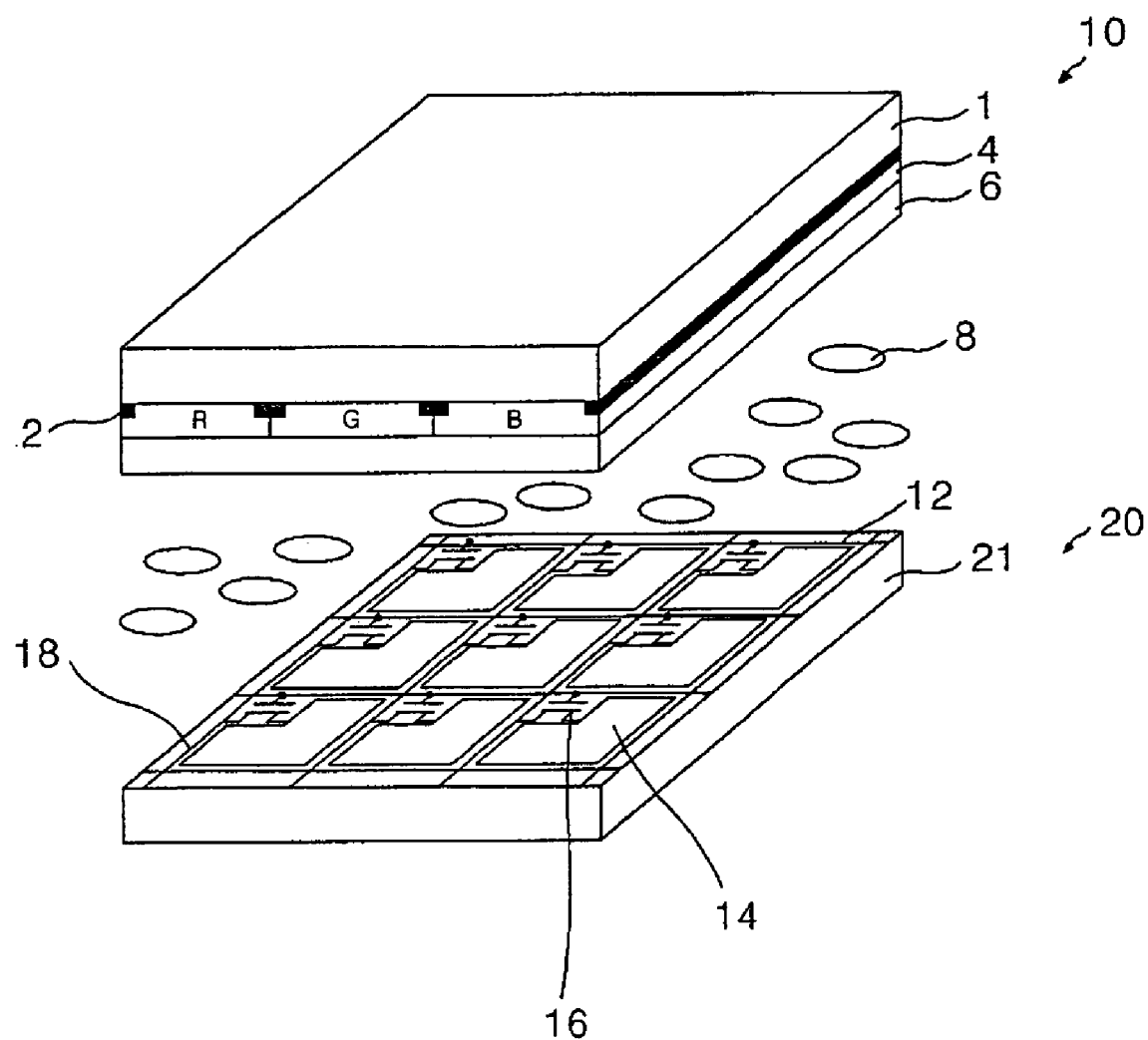
FIG. 1 is a perspective view showing a related art liquid crystal display panel.
Figure 2:
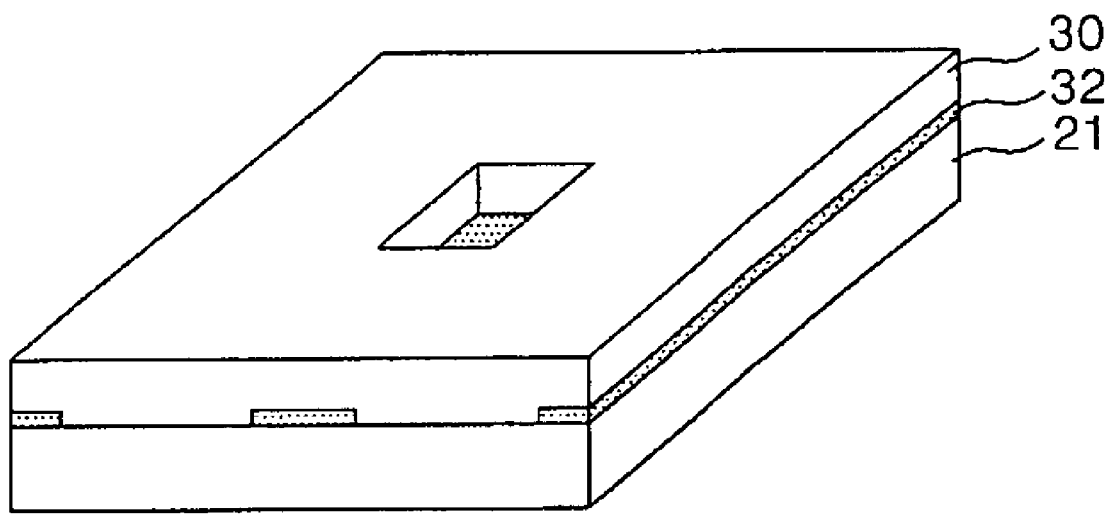
FIG. 2 is a perspective view showing a related art insulating film exposing a metal pattern.
Figure 3:
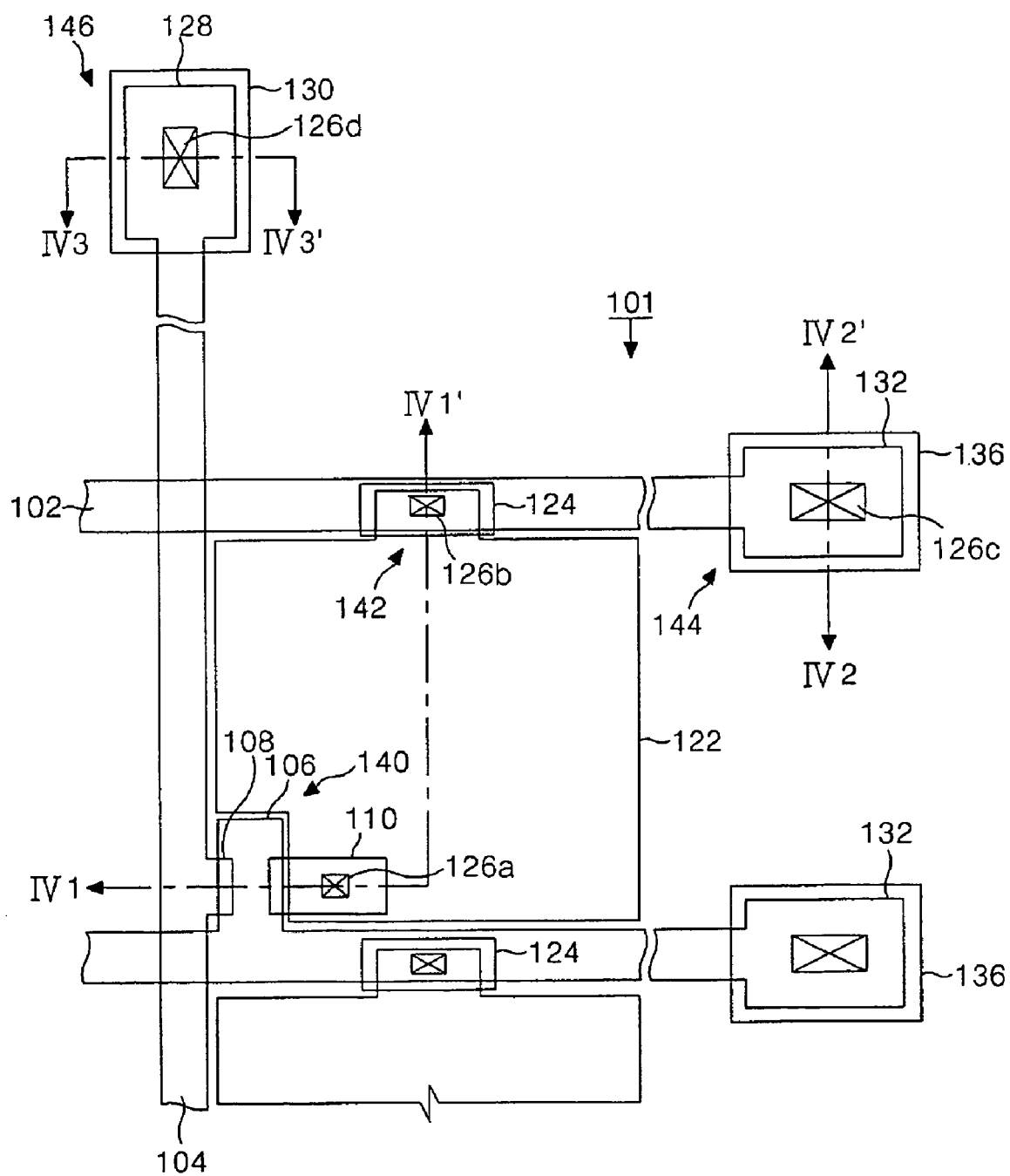
FIG. 3 is a plan view showing the liquid crystal display panel according to the present invention.
Figure 4:
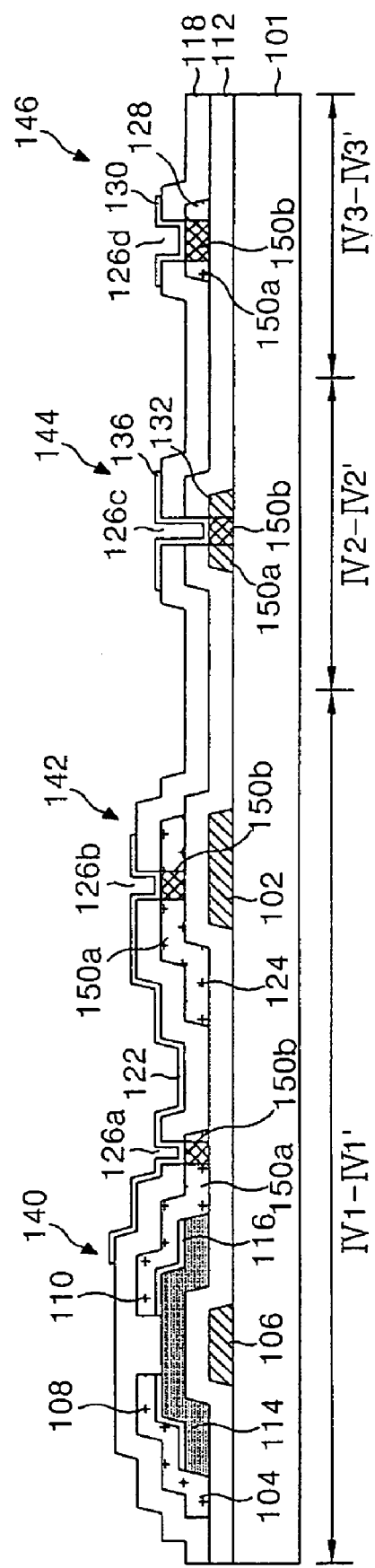
FIG. 4 is a sectional view of the liquid crystal display panel taken along the lines $IV_1$-$IV_1'$, $IV_2$-$IV_2'$ and $IV_3$-$IV_3'$ in FIG. 3.

FIG. 3 is a plan view representing a lower array substrate of a liquid crystal display panel, and FIG. 4 is a sectional view of the lower array substrate of the liquid crystal display panel taken along the lines IV1-IV1' and IV2-IV2' in FIG. 3.

Referring to FIGS. 3 and 4, the thin film transistor array substrate according to the present invention comprises a gate line 102 and a data line 104, having a gate insulating film 112 therebetween and formed on a lower substrate 101 in such a manner to intersect each other, a thin film transistor 140 formed at each intersection, and a pixel electrode 122 in a pixel region defined by the intersection. In addition, the thin film transistor array substrate further comprises a storage capacitor 142 formed at an overlapped portion between the gate line 102 and the pixel electrode 122, a gate pad 144 connected to the gate line 102, and a data pad 146 connected to the data line 104.

The gate line 102 that supplies a gate signal and the data line 104 that supplies a data signal are formed in an intersection structure, to thereby define the pixel region.

The thin film transistor 140 responds to a gate signal of the gate line 102 so that the pixel signal of the data line 104 is charged in the pixel electrode 122. To this end, the thin film transistor 140 includes a gate electrode 106 connected to the gate line 102, a source electrode 108 connected to the data line 104, and a drain electrode 110 connected to the pixel electrode 122. Moreover, the thin film transistor 140 further includes an active layer 114 overlapping the gate electrode 106 with a gate insulating film 112 positioned therebetween and defining a channel between the source electrode 108 and the drain electrode 110.

An ohmic contact layer 116 for making an ohmic contact with the source electrode 108 and the drain electrode 110 is further formed on the active layer 148.

The pixel electrode 122 is connected to the drain electrode 110 of the thin film transistor 140 via a first contact hole 126a passing through the passivation film 118 and is formed in the pixel region.

Accordingly, an electric field is formed between the pixel electrode 122 to which the pixel signal is supplied via the thin film transistor 140 and a common electrode (not shown) to which the reference voltage is supplied. Therefore, the liquid crystal molecules arranged between the thin film transistor array substrate and the color filter array substrate by the electric field start to rotate due to a dielectric anisotropy. The light transmittance of the pixel region changes in accordance with an amount of rotation of the liquid crystal molecules and thereby the pictures can be represented.

The storage capacitor 142 includes a gate line 102, a storage electrode 124 overlapping with the gate line 102 with the gate insulating film 112 therebetween and a pixel electrode 122 connected to the storage electrode 124 via a second contact hole 126b extending through the passivation film 118. The storage capacitor 142 allows a pixel signal charged in the pixel electrode 122 to be maintained stably until the next pixel signal is charged.

The gate pad 144 is connected to a gate driver (not shown) and supplies a gate signal provided from the gate driver to the gate line 102. The gate pad 144 includes a lower gate pad electrode 132 extended from the gate line 102 and an upper data pad electrode 136 connected to the lower data pad electrode 132 via a third contact hole 126c passing through the gate insulating film 112 and the passivation film 118.

The data pad 146 is connected to a data driver (not shown) and supplies a data signal provided from the data driver to the data line 104. The data pad 146 includes a lower data pad electrode 128 extended from the data line 104, and an upper data pad electrode 130 connected to the lower data pad electrode 128 via a fourth contact hole 126d passing through the passivation film 118.

On the other hand, a metal pattern includes at least any one of the drain electrode 110, the storage electrode 124, the lower gate electrode 132 and the lower data electrode 128 exposed by the first to the fourth contact holes 126a, 126b, 126c and 126d and is divided into a hydrophobic region 150b and a hydrophilic 150a. The insulating film including at least any one of the gate insulating film 112 and the passivation film 118 is not formed in the hydrophobic region 150b of the metal pattern, while the insulating film is formed in the hydrophilic 150a of the metal pattern. That is, the insulating film, which is of a hydrophilic material does not react with the hydrophobic region, and may be formed using a dipping method, a spin-coating method or a printing method. For example, the insulating film is made of a high polymer organic insulating material including a polyvinyl alcohol, a polyvinyl phenol and a novolak resin, etc, or an inorganic insulating material dispersed to a solvent such as an alcohol system and water; an organic/inorganic hybrid material; and a metal dispersion solution dispersed in a nano-particle type, etc. The insulating film is selectively formed to cover the metal pattern of the hydrophilic region by depositing an insulating material without the photolithography process and the etching process.

As described above, in the liquid crystal display panel according to the present invention, at least one insulating film of the gate insulating film and the passivation film is selectively formed in the hydrophilic region or the hydrophobic region of the metal pattern, which results in the fabricating process being simplified, to thereby improve productivity.

Figure 5A:
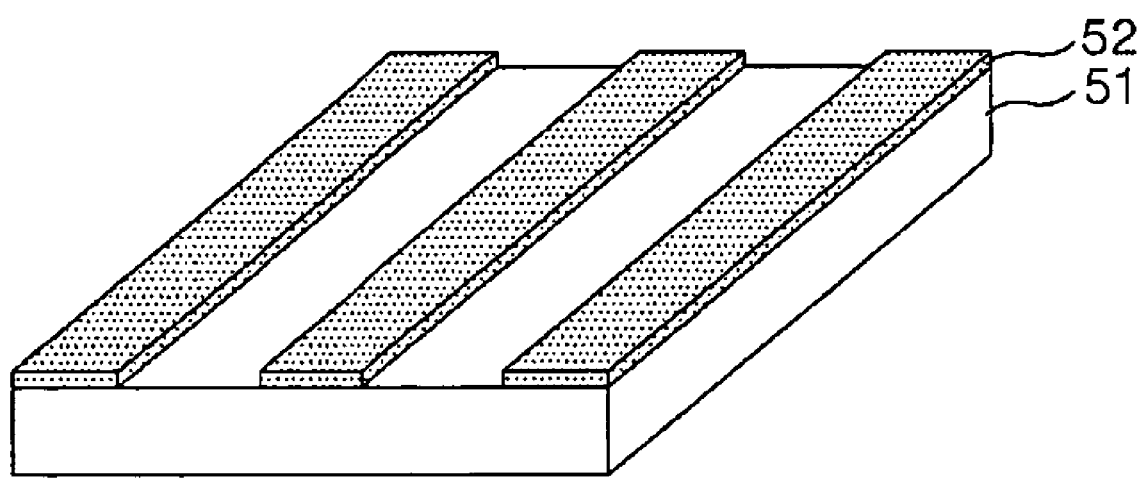
FIGS. 5A to 5C are perspective views illustrating thin film structures made by, and an apparatus usable with a manufacturing process for forming an insulating film exposing the metal pattern according to the present invention.
Figure 5B:
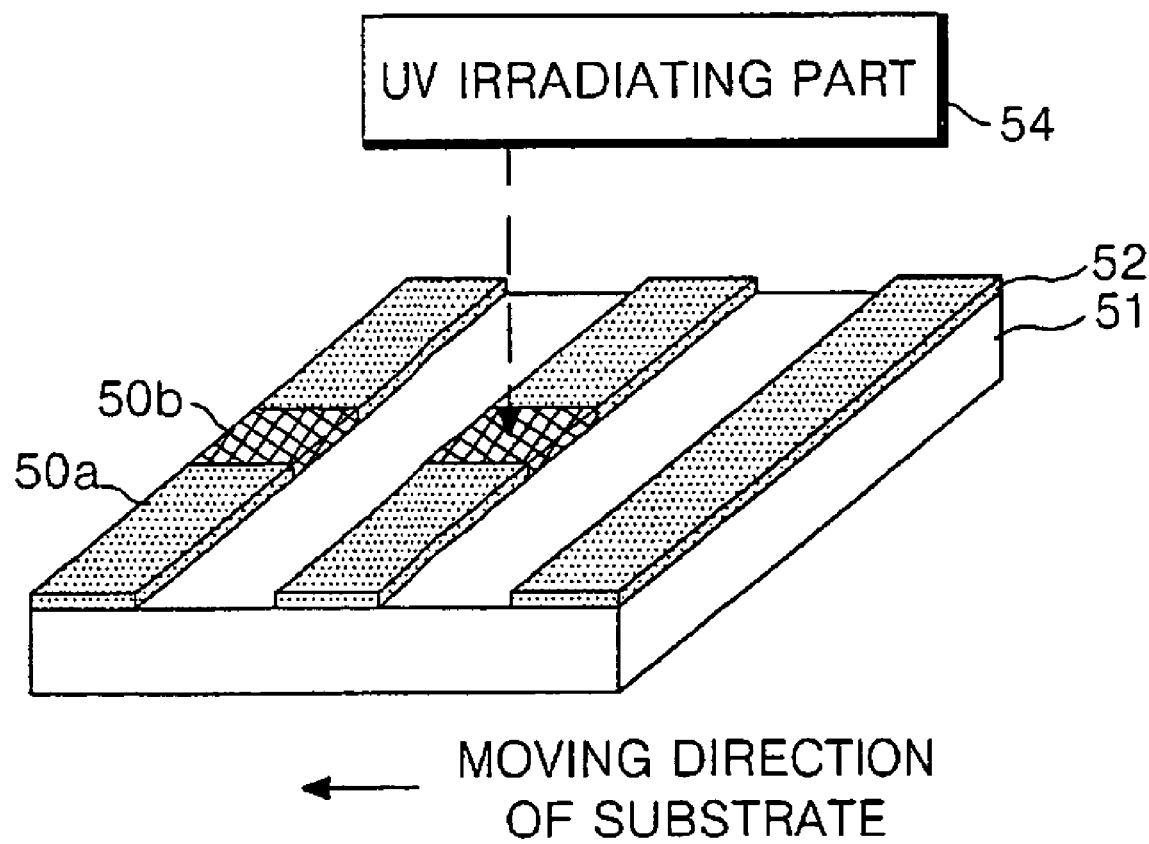
Figure 5C:
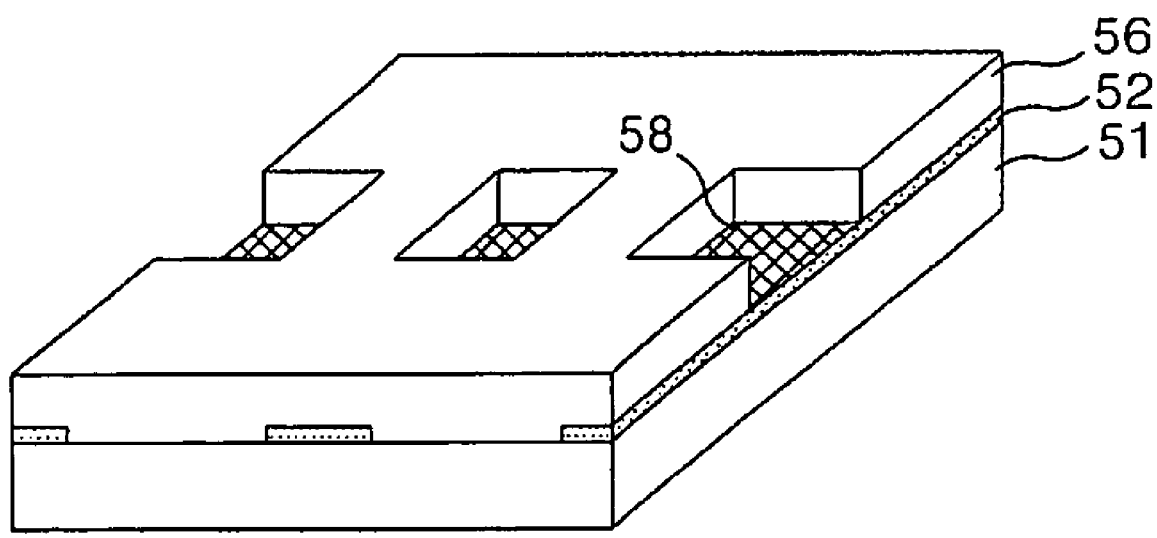

FIGS. 5A to 5C are sectional views illustrating thin film structures made by, and an apparatus usable with a manufacturing method for forming an insulating film exposing a metal pattern according to the present invention.

At first, a metal layer is deposited on the lower substrate 51 and then is patterned by the photolithography and the etching process using a mask, to thereby form a metal pattern 52 as shown in FIG. 5A. The metal pattern 52 includes at least any one of, for example, the lower gate electrode, the drain electrode, the storage electrode and the lower data electrode. In this case, the metal pattern has a hydrophilic property.

AS shown in FIG. 5B, an ultraviolet (UV) irradiating part 54 is arranged on the lower substrate 51 having the metal pattern 52 thereon. The ultraviolet irradiating part 54 irradiates a designated portion of the metal pattern 52 with UV radiation. The UV irradiates to the metal pattern 52 using the UV irradiating part 54 while moving the substrate 51 having the metal pattern 52 to one side, or the UV irradiates the substrate 51 having the metal pattern 52 while moving the UV irradiating part 54 to one side.

The designated portion of the metal pattern 52, which receives the UV radiation, is changed to a hydrophobic region because an —OH group of end group on the surface is separated or displaced. In other words, the hydrophobic region 50b of the metal pattern 52 is a region that is irradiated by UV and the hydrophilic region 50a of the metal pattern 52 is a region that is not irradiated by UV.

An insulating material in a solution state is applied using a dipping method, a spin-coating method or a printing method on the metal pattern 52 divided into the hydrophobic region 50b and the hydrophilic region 50a, to thereby form the insulating film 56 including at least any one of the gate insulating film and the passivation film as shown in FIG. 5C. The insulating film 56 is formed in order to cover the metal pattern 52 of the hydrophilic region 50a except for the hydrophobic region 50b, that is, in order to have a hole 58 exposing the hydrophobic region 50b. The hole 58, for example, includes a first contact hole passing through the passivation film to expose the drain electrode; a second contact hole passing through the passivation film to expose the storage electrode; a third contact hole passing through the gate insulating film and the passivation film to the lower gate electrode; and a fourth contact hole passing through the passivation film to expose the lower data electrode.

FIGS. 6A to 6D are sectional views illustrating other examples of thin film devices using, and an apparatus usable with, a manufacturing method for forming the insulating film according to the present invention.

Figure 6A:
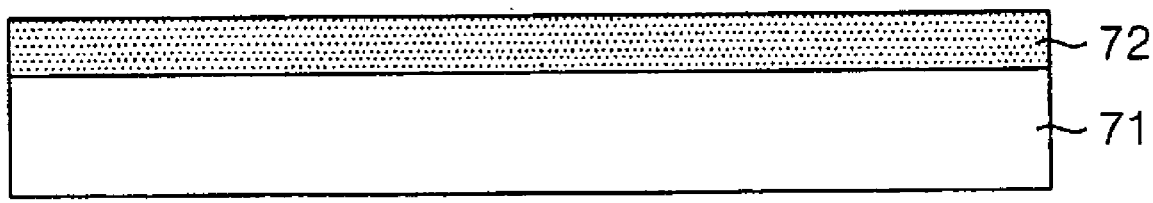
FIGS. 6A to 6D are sectional views illustrating other thin film structures made by, and a apparatus usable with manufacturing processes for forming the insulating film exposing the metal pattern according to the present invention.

Firstly, a metal layer is deposited on the lower substrate 71 and is then patterned by a photolithography process and an etching process using a mask, to thereby form a metal pattern 72 as shown in FIG. 6A. The metal pattern 72 includes at least any one of, for example, the lower gate electrode, the drain electrode, the storage electrode and the lower data electrode.

Figure 6B:
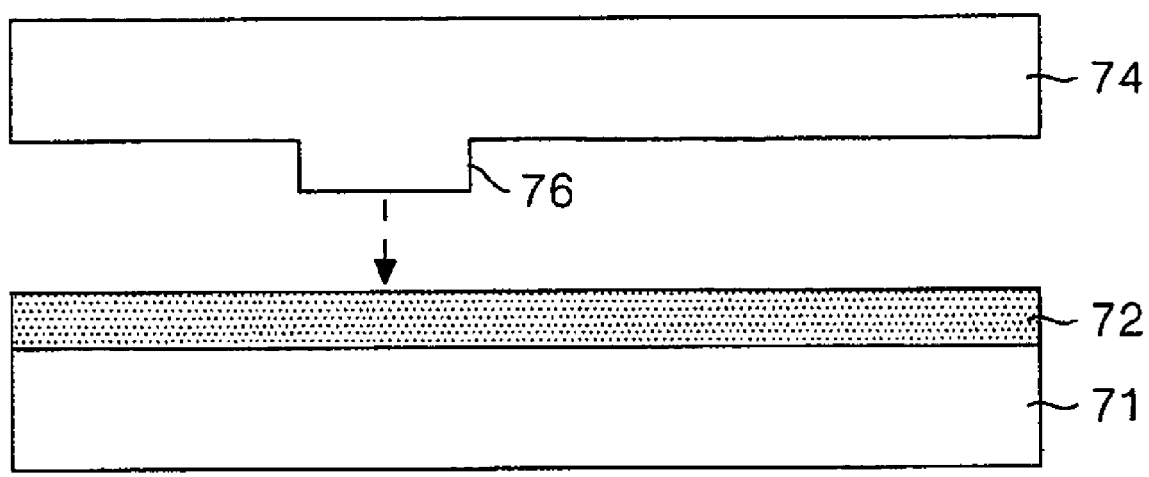
Figure 6C:
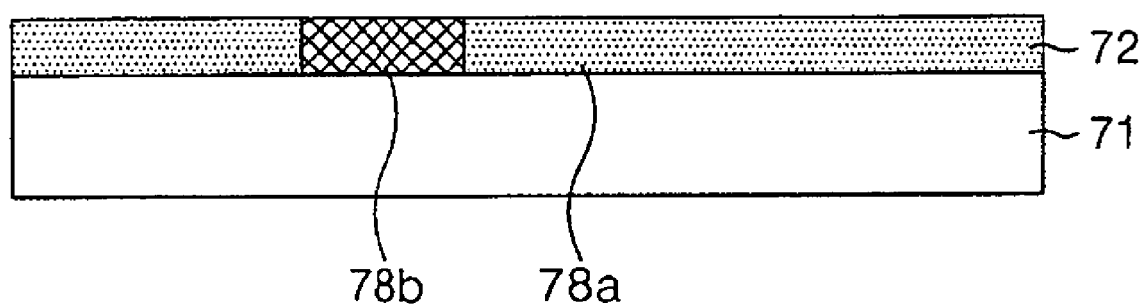

A pattern mold material having a protrusion 76 is arranged on a lower substrate on which the metal pattern is formed, as shown in FIG. 6B. The pattern mold material 74 is made of, for example, a polydimethysioxane (PDMS). The metal pattern 72 is force pressed for stamping using the pattern mold material 74. Accordingly, a designated portion of the metal pattern 72 connected to the protrusion 76 of the pattern mold material 74, —OH group of end group on the surface is separated so that the designated portion changes to a hydrophobic region 78b. As a result, the metal pattern 72 is divided into hydrophobic region 78b and hydrophilic region(s) 78a. That is, the hydrophobic region 78b of the metal pattern 72 becomes an area contacted with the protrusion 76 of the pattern mold material 74 and the hydrophilic 78a becomes an area that is not contacted with the protrusion 76 of the pattern mold material 74.

Figure 6D:
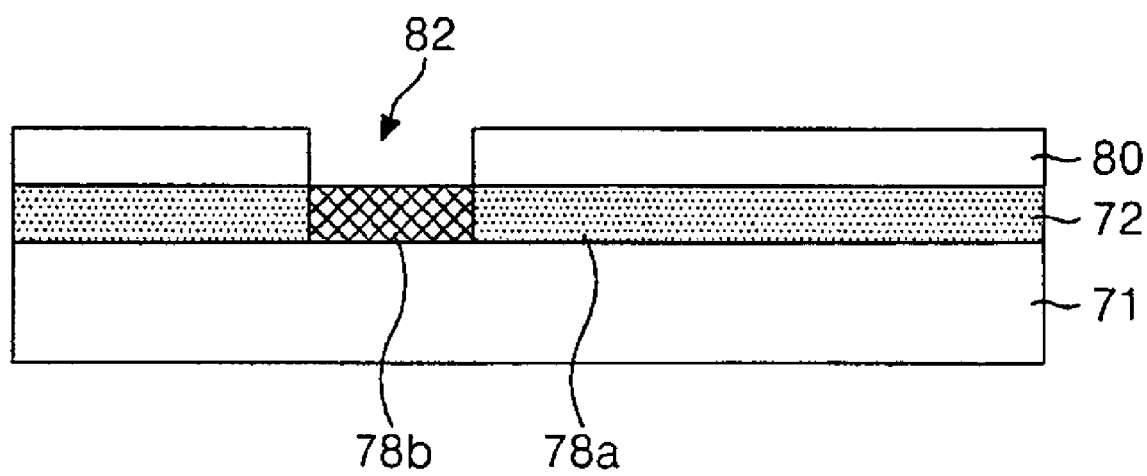

An insulating material is applied using a dipping method, a spin-coating method or a printing method on the metal pattern 72 divided into the hydrophobic region 78b and the hydrophilic region 78a, to thereby form an insulating film 80 including at least any one of the gate insulating film and the passivation film as shown in FIG. 6D. The insulating film 80 is formed in order to expose the hydrophobic region 78b of the metal pattern 72 and thus cover the hydrophilic region 78a of the metal pattern 72, that is, in order to have a hole 82 exposing the hydrophobic region 78b.

Alternatively, the insulating film may be formed by selectively converting a hydrophobic region of a metal pattern into a hydrophilic region using a pattern mold material of a hydrophilic property.

As explained above, according to the present invention, an insulating film is formed on a drain electrode, a storage electrode, a lower gate electrode and a lower data electrode, wherein the insulating film may be formed on an area exposing other metal patterns and used in a liquid crystal display panel as well as other display panels.

As described above, in a liquid crystal display panel and a fabricating method thereof according to the present invention, a metal pattern is divided into a hydrophobic region and a hydrophilic region, so that an insulating film of hydrophilic material is formed in order to expose the hydrophobic region. Because an insulating film exposing a part of the metal pattern can be formed merely by using an applying process without a photolithography using a mask, which results in that the fabricating process is simplified and thus a productivity will be improved.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of fabricating a liquid crystal display panel, comprising:

forming a metal pattern;

surface-processing the metal pattern in order to have a first surface processing region and a second surface processing region that have different reacting properties for a specific solution; and forming without photolithography an insulating film of a material having a reaction property identical to that of the second surface processing region on the metal pattern of the second surface processing region in order to expose the first surface processing region of the metal pattern, wherein the step of surface-processing the metal pattern includes forming the first surface processing region by irradiating a portion of the second surface processing region with UV (ultraviolet) light.

2. The method according claim 1, wherein the first surface processing region is a hydrophobic region and the second surface processing region is a hydrophilic region.

3. The method according claim 1, wherein the insulating film is made of a hydrophilic material.

4. The method according claim 1, wherein the insulating film includes at least any one of:

a high polymer organic insulating material having a polyvinyl alcohol, a polyvinyl phenol and a novolak resin;

an inorganic insulating material dispersed to a solvent; and an organic/inorganic hybrid insulating material.

5. A method of fabricating a liquid crystal display panel, comprising:

forming a metal pattern;

surface-processing the metal pattern in order to have a first surface processing region and a second surface processing region that have different reacting properties for a specific solution; and forming without photolithography an insulating film of a material having a reaction property identical to that of the second surface processing region on the metal pattern of the second surface processing region in order to expose the first surface processing region of the metal pattern;

wherein the step of surface-processing the metal pattern includes forming the first surface processing region by pressuring a pattern mold material on a portion of the second surface processing region.

* * * * *